(12) United States Patent
Weber et al.

(10) Patent No.: US 7,768,721 B2
(45) Date of Patent: Aug. 3, 2010

(54) OPTICAL ASSEMBLY, PROJECTION EXPOSURE APPARATUS AND PROJECTION OBJECTIVE

(75) Inventors: Jochen Weber, Grosskuchen (DE); Erich Merz, Essingen (DE); Ole Fluegge, Bartholomae (DE); Kai-Uwe Berroth, Heldenfingen (DE); Cornelia Buehler, Oberkochen (DE); Markus Hauf, Ulm (DE)

(73) Assignee: Carl Zeiss SMT AG, Oberkochen (DE)

( * ) Notice: Subject to any disclaimer, the term of this patent is extended or adjusted under 35 U.S.C. 154(b) by 221 days.

(21) Appl. No.: 12/143,322

(22) Filed: Jun. 20, 2008

(65) Prior Publication Data

US 2008/0316621 A1 Dec. 25, 2008

Related U.S. Application Data

(60) Provisional application No. 60/945,695, filed on Jun. 22, 2007.

(30) Foreign Application Priority Data

Jun. 22, 2007 (DE) .................... 10 2007 029 329

(51) Int. Cl.
*G02B 7/02* (2006.01)

(52) U.S. Cl. ..................... 359/811; 359/813

(58) Field of Classification Search ............... None
See application file for complete search history.

(56) References Cited

U.S. PATENT DOCUMENTS 6,809,794 B1 10/2004 Sewell
7,061,698 B2 6/2006 Osterried et al.

FOREIGN PATENT DOCUMENTS

| DE | 101 213 46 | 11/2002 |
|----|-----------|---------|
| DE | 10 2006 038 294 | 3/2007 |
| JP | 9-16988 | * 9/1997 |
| WO | WO 01/98811 | 12/2001 |
| WO | WO 2005/101121 | 10/2005 |
| WO | WO 2006/069755 | 7/2006 |
| WO | WO 2007/031413 | 3/2007 |

* cited by examiner

*Primary Examiner*—Timothy J Thompson
(74) *Attorney, Agent, or Firm*—Fish & Richardson P.C.

(57) ABSTRACT

In some embodiments, the disclosure relates to an optical assembly that includes an optical element and a structure element. A gap runs between the optical element and the structure element. A sealing element may be present to seal the gap. At least one liquid layer may be arranged between the structure element and/or the optical element, and the sealing element so that a relative displacement of the sealing element with respect to the structure element and/or the optical element is possible in the direction of the layer plane.

26 Claims, 4 Drawing Sheets

OPTICAL ASSEMBLY, PROJECTION EXPOSURE APPARATUS AND PROJECTION OBJECTIVE

CROSS-REFERENCE TO RELATED APPLICATIONS

The application claims priority under 35 U.S.C. §119(e)(1) to U.S. provisional patent application Ser. No. 60/945,695, filed Jun. 22, 2007. The application also claims priority under 35 U.S.C. §119 to German patent application serial number 10 2007 029 329.3, filed Jun. 22, 2007. The entire contents of both U.S. provisional patent application Ser. No. 60/945,695 and German patent application serial number 10 2007 029 329.3 are incorporated herein by reference.

FIELD

The disclosure relates to an optical assembly, a projection exposure apparatus for semiconductor lithography, and a projection objective for semiconductor lithography.

BACKGROUND

Projection exposure apparatuses for semiconductor lithography serve to expose structures onto a substrate coated with photosensitive materials. Typically, the substrate is predominantly composed of silicon and is referred to as a wafer. The wafer can be used to produce semiconductor components, such as, for example, computer chips.

FIG. 1 illustrates an exemplary projection exposure apparatus 1 according to the prior art. The projection exposure apparatus 1 includes an illumination device 3, a device 4 for receiving and exactly positioning a mask provided with a structure, a so-called reticle 5, which determines the later structures on a wafer 2. The projection exposure apparatus also includes a device 6 for holding, moving and exactly positioning precisely the wafer 2, and an imaging device 7, commonly referred to as a projection objective 7. The device 7 has a plurality of optical elements 8 mounted via mounts 9 in an objective housing 10. Exemplary optical elements include lenses, mirrors, prisms, terminating plates and the like.

The illumination device 3 provides a projection beam 11 to image the reticle 5 on the wafer 2. The projection beam 11 can be, for example, light or more generally generally electromagnetic radiation. A laser or the like can be used as a source of the radiation. The radiation is shaped via optical elements in the illumination device 3 such that the projection beam 11 has the desired properties with regard to diameter, polarization, shape of the wavefront and the like when it impinges on the reticle 5. An image of the reticle 5 is generated via the projection beam 11 and is correspondingly transferred to the wafer 2 by the projection objective 7.

With this arrangement, the projection exposure apparatus 1 allows structures in the reticle 5 to be imaged onto the wafer 2. After being exposed to the projection beam 11, the wafer 2 can be moved in the direction of the arrow, so that a multiplicity of individual fields of the wafer 2 (areas of the wafer 2) can be exposed. In some instances, the reticle 5 is scanned continuously through a slotted diaphragm.

SUMMARY

The disclosure can provide an optical assembly, a projection objective for semiconductor lithography, and a projection exposure apparatus for semiconductor lithography, with good sealing of optical elements with respect to surrounding structure elements. In some embodiments, this can be achieved without additional, disturbing forces being transmitted from the surrounding structure elements to the optical elements on account of the sealing elements used.

In one aspect, the disclosure features an optical assembly that includes an optical element and a structure element, where a gap is present between the optical element and the structure element. The optical assembly also includes a sealing element and a liquid layer. The liqid layer is between the sealing element and the structure element and/or the optical element. The optical assembly is configured so that there can be relative motion between the sealing element (on the one hand) and the structure element and/or the optical element (on the other hand) in a direction perpendicular to the optical axis of the optical assembly.

In some embodiments, the optical assembly described in the preceding paragraph is in a projection exposure apparatus for semiconductor lithography. In certain embodiments, the optical assembly described in the preceding paragraph is in a projection objective for semiconductor lithography.

In some embodiments, the optical assembly includes an optical element and a structure element. The optical element can be for example a lens or some other refractive or diffractive element, and the structure element can be a mount part. The optical assembly can be part of a projection objective for semiconductor lithography. The projection objective can be part of a projection exposure apparatus for semiconductor lithography.

A gap can run between the optical element and the structure element, such that the optical element is connected to the structure element only at individual bearing points. In some embodiments, the gap has a thickness in the range of approximately 0.1 mm to 0.5 mm (e.g., in the range of 0.2 mm to 0.4 mm). It can be sealed with a sealing element and a liquid layer that runs between the sealing element and the structure element and/or the optical element. A relative displacement of the sealing element with respect to the structure element and/or the optical element can be possible along the layer plane of the liquid layer.

With the liquid layer, the region between the sealing element and the structure element and/or the optical element can be sealed, while also allowing movement of the sealing element relative to the structure element and/or the optical element parallel to the layer plane. Furthermore, a good mechanical decoupling of the sealing element from the optical element and/or the structure element can be achieved. This can effectively compensate both for slow relative movements of the involved partners with respect to one another (e.g., due to a gradual change in temperature) and for dynamic movements (e.g., due to vibrations).

The thickness of the liquid layer can depend, for example, on the surface tension of the liquid used and on the area covered by the liquid layer. This can allow for the possibility of setting the thickness of the liquid layer in a defined manner through the choice of, for example, the aforementioned parameters in the construction of the optical assembly.

The surface tension of the liquid used for the liquid layer and hence the capillary forces in the region between the sealing element and the optical element and/or the structure element can provide that the sealing element itself is held in position in the direction of the optical axis of the optical assembly, while the liquid layer itself is also held in the desired region.

The optical axis of the optical assembly can be predetermined by the optical axis of the projection objective.

In some embodiments, the liquid layer has a thickness in the range of 1 µm to 10 µm. In certain embodiments, the liquid layer has a lateral extent along the layer plane, in particular perpendicular to the optical axis, in the range of approximately 2 mm to approximately 8 mm.

A very effective mechanical decoupling can be achieved by arranging a first liquid layer between the structure element and the sealing element and a second liquid layer between the optical element and the sealing element. In some embodiments, the liquid layers can be substantially planar layers. In certain embodiments, the liquid layer between the structure element and the sealing element can deviate for example by approximately 0° to 20° from the direction of the optical axis of the optical assembly. In some embodiments, the liquid layer between the optical element and the sealing element can deviate by approximately 70° to 110° from the direction of the optical axis of the optical assembly. This geometric arrangement of the liquid layers can help ensure that an effective mechanical decoupling of the sealing element from the optical element and also from the structure element is achieved both in the direction of the optical axis and perpendicular to the direction of the optical axis.

In the case of curved optical elements, the liquid layer can be formed as a curved layer. It can be advantageous for the sealing element to be formed as a curved lamina having, for example, a thickness in the range of approximately 5 µm to 15 µm.

High-grade steel can be an advantageous choice for the material of the sealing element. High-grade steel can exhibit the property of not allowing ultraviolet radiation to pass therethrough. This can effectively shield the liquid layer from, for example, ultraviolet radiation that may be used during use of the projection exposure apparatus. This can be advantageous particularly in the case where the optical assembly is used as part of a projection objective for semiconductor lithography, because, in these applications, ultraviolet radiation having a short wavelength is regularly employed as optical useful radiation. The aforementioned measure can prevent the high-energy ultraviolet radiation from decomposing the liquid used for the liquid layer, which could otherwise impair the effectiveness of the optical assembly.

Optionally, the sealing element can be formed of quartz. This can provide the advantage that, particularly when using optical elements composed of quartz, the liquid layer is delimited on both sides by elements composed of the same material, whereby defined conditions for the seal can be established in a simple manner.

In certain embodiments, an improved mechanical decoupling of optical element and structure element in the direction of the optical axis can be achieved by virtue of the fact that the sealing element has an undulatory structure in the region of the gap. The undulating structure advantageously runs in the direction of the gap. This can result in a reduction of the stiffness of the sealing element in the direction of the optical axis, such that the forces input on account of relative movements of the optical element with respect to the structure element in the direction of the optical axis are relatively small.

The sealing element can be fixed to the structure element using various connecting techniques (e.g., adhesive bonding, vulcanization, clamping, etc.).

In cases where the optical element is a plane-parallel plate, just the geometry of the optical element alone can help ensure that no forces are introduced in the direction of the optical axis on account of relative movements of the optical element with respect to the structure element vertically with respect to the optical axis. In cases where the optical element exhibits a curved surface (e.g., the optical element is a lens), a similar effect can be achieved by forming the lens edge in a substantially plane fashion in the region in which it is covered by the sealing element.

In some embodiments, to maintain the functionality of the optical assembly, it can be advantageous to counteract creepage of the liquid used for the liquid layer in the direction of the optically active region of the optical element. Optically active region is understood to be that region of the optical element through which the optical useful radiation passes when the optical assembly is used as intended. In particular, creepage of the liquid in the direction of the optically active region can be counteracted by a peripheral groove and/or a peripheral wall being arranged in that region of the optical element which adjoins the sealing element. The groove and/or wall can prevent the liquid layer from propagating further in the direction of the optically active region.

In certain embodiments, the lifetime of the optical assembly can be increased because at least one cavity for receiving a liquid supply is present in the region of the liquid layer in the optical element and/or in the structure element. In the case of outgassing of the liquid layer or some other loss of liquid, reserve liquid is redrawn via the capillary forces from the aforementioned cavity into the region of the liquid layer. This can prevent or delay dry operation of the sealing element on the optical element and/or the structure element.

In some embodiments, the bearing of the optical element can be a so-called isostatic bearing. A bearing of this type involves a point bearing of the optical element at three bearing locations with no moments introduced into the optical element. This can largely avoid stresses in the optical element.

In some embodiments, the disclosure can advantageously also be used for upgrading conventional leaky seals already present. A leaky seal refers to a seal in which a certain gas flow between the optical element and the surrounding structure is accepted. Sealing concepts of this type are disclosed for example in WO 2006/069755 A2. In the case where a leaky seal is present, the leaky seal to be upgraded is supplemented by the sealing element and the liquid layer. In other words, the optical element and/or the structure element and/or the gap can be formed in such a way that a leaky seal is realized in the absence of the sealing element. In this case, the liquid layer can have, for example, a kinematic viscosity v that is in the range of 300-3000 mm$^2$/s.

In certain embodiments, the optical assembly can advantageously be used in a projection objective of a projection exposure apparatus for semiconductor lithography. In this case, for sealing a projection objective with respect to the environment, the optical assembly can be used to contain the first and/or the last optical element of the projection exposure apparatus.

In some embodiments, the optical assembly is in a projection objective for microlithography with a given field size and aperture for example as a correction element in the region of a pupil plane. For example, the distance from the latter which corresponds to a subaperture ratio of greater than 0.7 (e.g., greater than 0.8) can be used. For an optical system which images an object field with a maximum object height onto an image field at a given aperture, the subaperture ratio is defined by $$|R-H|/(|R-H|+|H|),$$

where if proceeding from an object point of maximum object height, R is the marginal ray height and H is the principal ray height, and these ray heights are measured in a given plane parallel to a pupil plane of the optical system.

The subaperture ratio assumes values of between 0 and 1. The subaperture ratio has the value 1 in each pupil plane of the optical system and the value 0 in each field plane of the optical system.

This definition is applied in particular for projection optics for semiconductor lithography since these are corrected for a maximum object height and maximum aperture, depending on the projection optic. As a result of this, a maximum object height and an aperture are naturally assigned to such projection optics as optical systems.

The abovementioned position in the objective is advantageous because in general the greatest contributions to the aberrations of a projection exposure apparatus originate from so-called pupil aberrations, which can be corrected the most effectively in the region of the pupil. Furthermore, the region of the pupil plane is a particularly favorable location for performing an image aberration correction via optical correction elements since, via measures in the pupil plane, it is possible to achieve identical modifications of the imaging in each location of an image plane.

Exemplary embodiments and variations of the disclosure are explained in more detail below with reference to the figures.

DETAILED DESCRIPTION

Figure 1:
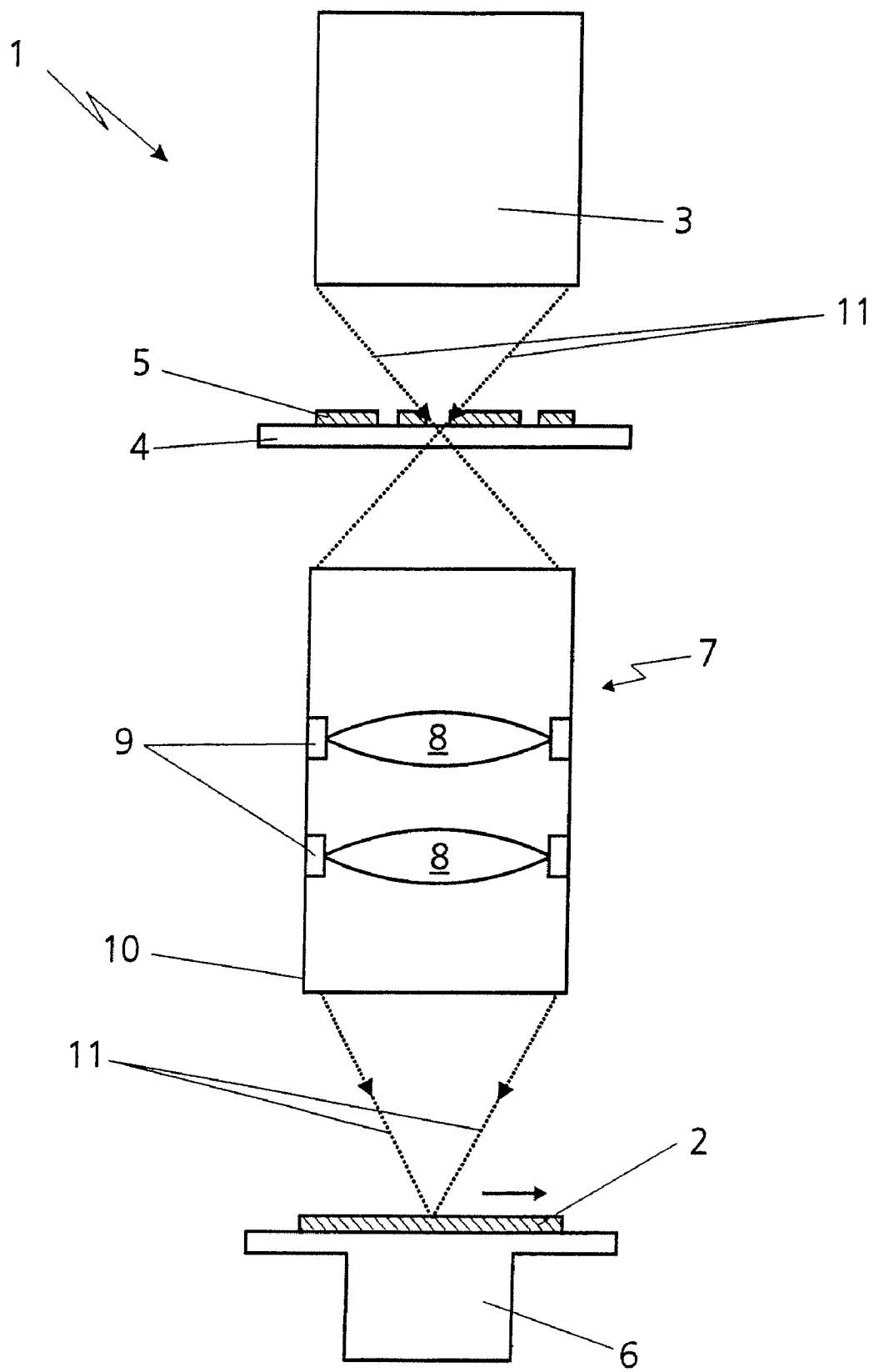
FIG. 1 shows a projection exposure apparatus according to the prior art.
Figure 2:
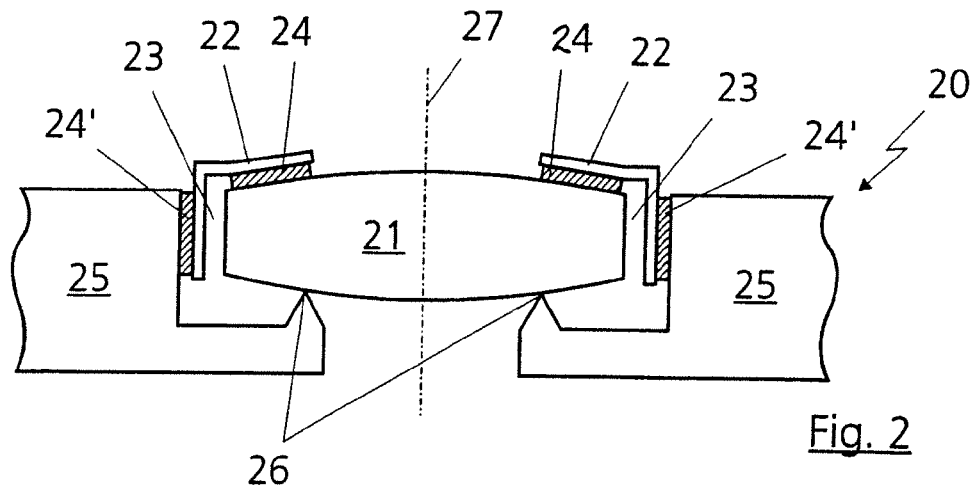
FIG. 2 shows an optical assembly.

FIG. 2 shows a sectional illustration of an optical assembly 20 with an optical element 21 that is a lens. The lens 21 rests within the structure element 25—formed as a mount—on three punctiform bearing locations 26, two of which are illustrated in FIG. 2. The sealing element 22 is arranged in the gap 23 between the optical element 21 and the structure element 25. Because of the curvature of the lens surface, the sealing element 22 is also adapted to the curvature of the lens surface in the region on which it lies on the curved lens surface via the liquid layer 24. The liquid layer 24 ensures a mobility of the sealing element 22 vertically with respect to the optical axis 27, without forces being introduced into the optical element 21 vertically with respect to the direction of the optical axis 27. Furthermore, the sealing element 22 is not fixedly connected to the structure element 25, but rather is likewise connected to the structure element 25 via the liquid layer 24'. This can help ensure that there is no rigid connection whatsoever of the sealing element 22 to the structure element 25 or else to the optical element 21. This measure can help ensure that the optical element 21 is mechanically decoupled in the best possible manner with respect to changes in the position of the surroundings, for example of the structure element 25, which may be attributed to a change in temperature, for example. An oil having a high surface tension but a low viscosity and a high vapor pressure can be advantageously used for the liquid layer in order to achieve good adhesion to the components with minimal shear forces and minimal contamination of the interior of a superordinate optical system.

The thickness of liquid layer 24 and/or 24' can be approximately 1 μm to approximately 10 μm. The lateral extent of liquid layer 24 and/or in 24' in a direction perpendicular to optical axis 27 it can be approximately 2 mm to 8 mm. The sealing element 22 can be formed of a high-grade steel element. The sealing element can have a thickness of approximately 5 μm to 15 μm. Optionally, sealing element 22 can be formed of a different material, such as quartz.

Figure 3:
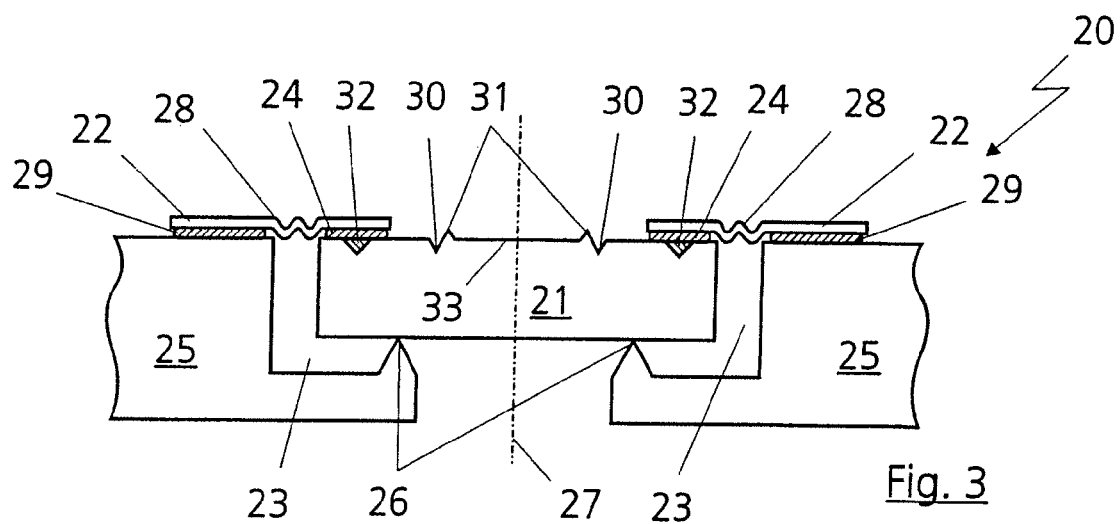
FIG. 3 shows an optical assembly, in which the optical element is formed as a plane-parallel plate.

In FIG. 3, the optical element 21 is formed as a plane-parallel plate, which, in a similar manner to that in the exemplary embodiment shown in FIG. 2, is mounted in a structure element 25—formed as a mount—via three bearing points 26, two of which are illustrated in FIG. 3. In the exemplary embodiment illustrated in FIG. 3, the sealing element 22 is fixedly connected to the structure element 25 via the vulcanization layer 29. In the example illustrated in FIG. 3, the mechanical decoupling of the optical element 21 from the structure element 25 in the direction of the optical axis 27 is achieved by virtue of the fact that the sealing element 22 has the undulatory structure 28 in the region of the gap 23, which structure facilitates flexure or bending of the sealing element 22 in the region of the gap 23 and in this way ensures the decoupling in the direction of the optical axis 27. Furthermore, in that region of the optical element 21 which is covered by the liquid layer 24, the cavity 32 is provided, which is filled with the liquid that forms the liquid layer 24. The cavity 32 can serve as a liquid reservoir for the liquid layer 24; that is to say that if liquid is lost from the region of the liquid layer 24, for example as a result of outgassing or creepage, reserve liquid can be redrawn from the cavity 32 on account of the capillary forces, such that the lifetime of the optical assembly 20 is significantly increased in this way. Furthermore, the groove 30 and the wall 31 are arranged in the region between the liquid layer 24 and the optically active region 33 of the optical element 21, the groove and wall preventing creepage of liquid from the liquid layer 24 in the direction of the optically active region 33 of the optical element and in this way ensuring the functionality of the optical assembly 20.

Figure 4:
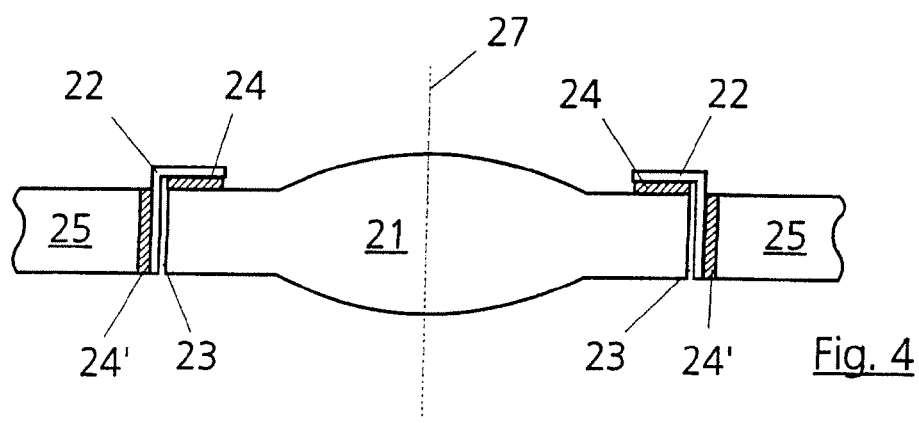
FIG. 4 shows an optical assembly.

FIG. 4 shows an optical assembly 20 in which the optical element 21 is curved but is formed with a flattened edge, which can prevent the situation in which, on account of forces vertically with respect to the optical axis 27, transverse forces are introduced in the direction of the optical axis 27 on account of the curvature of the optical element 21.

Figure 5:
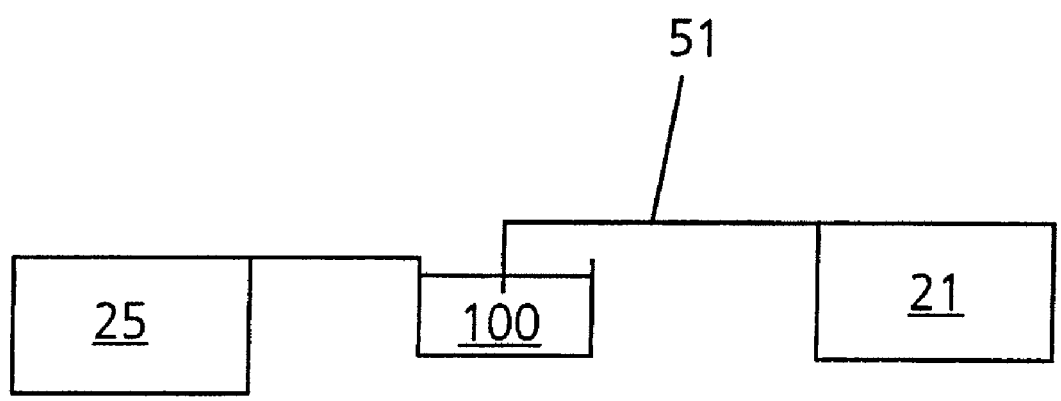
FIG. 5 shows an optical assembly.

A seal between the optical element 21 and a structure element 25 can also be implemented according to the siphon principle illustrated in FIG. 5. For example, a liquid reservoir 100 can be fitted to the structure element 25, into which engages a sealing lip 51 fitted to the optical element 21 in order to produce a sealing effect. The optical element 21 and the structure element 25 can also be interchanged with regard to the sealing lip 51 and the reservoir 100.

Figure 6:
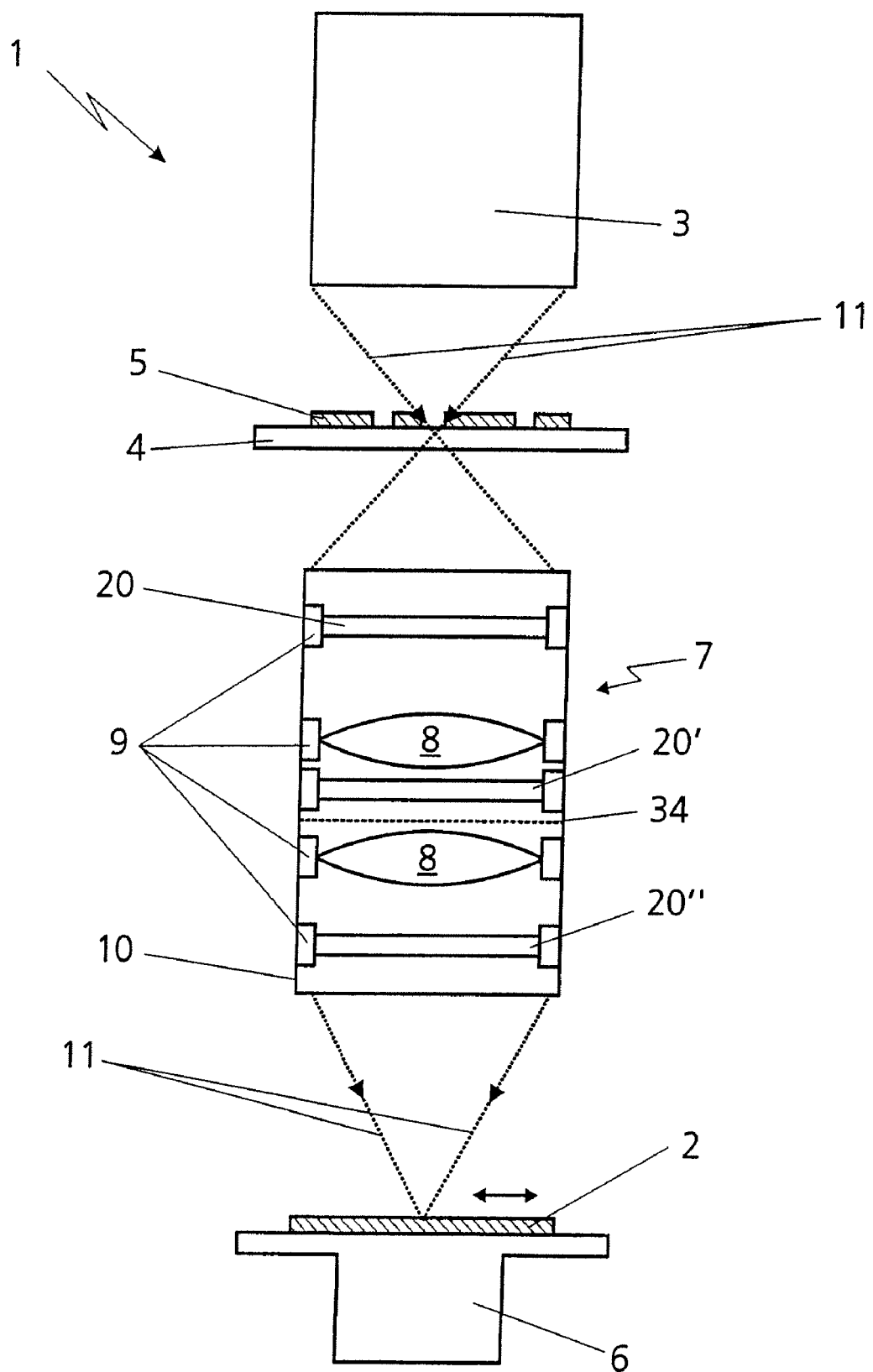
FIG. 6 shows a projection exposure apparatus for semiconductor lithography which contains a plurality of the optical assemblies.

FIG. 6 shows a projection exposure apparatus for semiconductor lithography 1 in which the optical assemblies 20, 20' and 20" are arranged in such a way that they are either situated in the region of a pupil plane 34 or contain the first and/or last optical element of the projection objective.

What is claimed is:
1. An optical assembly having an optical axis, the optical assembly comprising:
   an optical element;
   a structure element, a gap being present between the optical element and the structure element;
   a sealing element; and
   a liquid layer between the sealing element and a first element, the first element comprising the structure element and/or the optical element, wherein the optical assembly is configured so that there can be relative motion between the sealing element and the first element in a direction perpendicular to the optical axis of the optical assembly.

2. The optical assembly according to claim 1, wherein the liquid layer has a thickness in the range of 1 μm to 10 μm.

3. The optical assembly according to claim 1, wherein the liquid layer has a lateral extent in the range of approximately 2 mm to 8 mm in the direction perpendicular to the optical axis of the optical assembly.

4. The optical assembly according to claim 1, wherein the liquid layer comprises first and second liquid layers, the first liquid layer is arranged between the structure element and the sealing element, and the second liquid layer is between the optical element and the sealing element.

5. The optical assembly according to claim 4, wherein the first and second liquid layers are substantially planar layers, the first liquid layer deviates by approximately 0°-20° from the direction of the optical axis of the optical assembly, and the second liquid layer deviates approximately by 70°-110° from the direction of the optical axis of the optical assembly.

6. The optical assembly according to claim 1, wherein the liquid layer is a curved layer.

7. The optical assembly according to claim 1, wherein the sealing element is a lamina having a thickness in the range of approximately 5 μm-15 μm.

8. The optical assembly according to claim 1, wherein the sealing element comprises high-grade steel.

9. The optical assembly according to claim 1, wherein the sealing element has an undulatory structure.

10. The optical assembly according to claim 1, wherein the sealing element comprises quartz.

11. The optical assembly according to claim 1, wherein the optical assembly is configured so that a leaky seal is realized in the absence of the sealing element.

12. The optical assembly according to claim 1, wherein the optical element is a plane-parallel plate.

13. The optical assembly according to claim 1, wherein the optical element is a non-plane optical element.

14. The optical assembly according to claim 13, wherein the optical element is substantially planar fashion in a region covered by the sealing element.

15. The optical assembly according to claim 1, further comprising a mechanism to counteract creepage of the liquid in a direction of an optically active region of the optical element, the mechanism being between the liquid layer and the optically active region of the optical element.

16. The optical assembly according to claim 15, wherein the mechanism comprises a wall, a groove in a surface of the optical element, or both.

17. The optical assembly according to claim 1, further comprising at least one cavity for receiving a liquid supply in a region of an element selected from the group consisting of the liquid layer, the optical element and the structure element.

18. The optical assembly according to claim 1, wherein the gap has a thickness in the range of 0.1 mm-0.5 mm.

19. The optical assembly according to claim 1, wherein the optical element is mounted at three bearing points in such a way that no moments are introduced into the optical element.

20. The optical assembly according to claim 1, wherein the liquid layer comprises a liquid having a kinematic viscosity v in the range of 300-3000 $mm^2/s$.

21. The optical assembly according to claim 1, wherein the optical assembly is configured to be used in a projection objective for semiconductor lithography.

22. The optical assembly according to claim 1, wherein the sealing element is in the gap.

23. An apparatus, comprising:
an optical assembly according to claim 1,
wherein the apparatus is a projection exposure apparatus for semiconductor lithography.

24. An objective, comprising:
an optical assembly according to claim 1,
wherein the objective is a projection objective for semiconductor lithography.

25. The projection objective according to claim 24, wherein the optical assembly contains a first of the projection objective, a last lens of the projection objective, or both.

26. The projection objective according to claim 24, wherein the optical assembly is arranged at a distance from a pupil plane which corresponds to a subaperture ratio of greater than 0.7.

* * * * *

UNITED STATES PATENT AND TRADEMARK OFFICE
CERTIFICATE OF CORRECTION

PATENT NO. : 7,768,721 B2  Page 1 of 1
APPLICATION NO. : 12/143322
DATED : August 3, 2010
INVENTOR(S) : Jochen Weber et al.

It is certified that error appears in the above-identified patent and that said Letters Patent is hereby corrected as shown below:

Column 2, Line 10, Delete "liqid" and insert -- liquid --.

Signed and Sealed this

Thirtieth Day of November, 2010

David J. Kappos
*Director of the United States Patent and Trademark Office*